United States Patent
Yamauchi et al.

(10) Patent No.: US 10,580,750 B2
(45) Date of Patent: Mar. 3, 2020

(54) ELECTRONIC COMPONENT

(71) Applicant: TAIYO YUDEN CO., LTD., Tokyo (JP)

(72) Inventors: Motoi Yamauchi, Tokyo (JP); Yuki Endo, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/103,443

(22) Filed: Aug. 14, 2018

(65) Prior Publication Data

US 2019/0081019 A1    Mar. 14, 2019

(30) Foreign Application Priority Data

Sep. 13, 2017   (JP) .................. 2017-176140

(51) Int. Cl.
| H01L 25/065 | (2006.01) |
| H01L 23/66 | (2006.01) |
| H03H 9/05 | (2006.01) |
| H01L 23/00 | (2006.01) |
| H03H 9/08 | (2006.01) |

(52) U.S. Cl.
CPC .............. *H01L 24/17* (2013.01); *H01L 23/66* (2013.01); *H01L 24/14* (2013.01); *H01L 25/0655* (2013.01); *H03H 9/059* (2013.01); *H03H 9/0523* (2013.01); *H03H 9/0566* (2013.01); *H01L 24/13* (2013.01); *H01L 2223/6677* (2013.01); *H01L 2224/13144* (2013.01); *H01L 2224/13147* (2013.01); *H01L 2224/1403* (2013.01); *H01L 2224/16227* (2013.01); *H01L 2224/16235* (2013.01);
(Continued)

(58) Field of Classification Search
CPC ..... H01L 23/66; H01L 24/17; H01L 25/0655; H01L 2224/1703; H03H 9/1064
See application file for complete search history.

(56) References Cited

U.S. PATENT DOCUMENTS

| 6,624,058 B1 * | 9/2003 | Kazama | ................ H01L 21/561 257/E21.504 |
| 2002/0043719 A1 * | 4/2002 | Iwaya | ................... H01L 21/563 257/723 |
| 2004/0113282 A1 * | 6/2004 | Hung | .................. H01L 23/3677 257/778 |

(Continued)

FOREIGN PATENT DOCUMENTS

| JP | 11-111771 A | 4/1999 |
| JP | 2000-269270 A | 9/2000 |

(Continued)

Primary Examiner — Allan R Wilson
(74) Attorney, Agent, or Firm — Stein IP, LLC

(57) ABSTRACT

An electronic component includes: four device chips having rectangular planar shapes and arranged on a substrate so that a corner of four corners constituting a rectangle of one device chip is adjacent to the corners of remaining three device chips; first pads located on surfaces of the four device chips and closest to the corner; one or more first bumps bonding the first pads to the substrate in the four device chips; second pads located on surfaces of the four device chips, the second pad being one of pads other than the first pad; and one or more second bumps bonding the second pads to the substrate in the four device chips, a sum of bonded areas between the one or more second bumps and the second pad being less than a sum of bonded areas between the first pad and the one or more first bumps.

18 Claims, 13 Drawing Sheets

(52) U.S. Cl.
CPC ............ *H01L 2224/16238* (2013.01); *H01L 2224/1703* (2013.01); *H01L 2224/1713* (2013.01); *H01L 2224/17106* (2013.01); *H01L 2224/17107* (2013.01); *H01L 2224/17179* (2013.01); *H01L 2924/014* (2013.01); *H03H 9/08* (2013.01)

(56) References Cited

U.S. PATENT DOCUMENTS

| | | | |
|---|---|---|---|
| 2005/0082580 A1* | 4/2005 | Hung | H01L 23/3677 257/222 |
| 2006/0186403 A1* | 8/2006 | Ezaki | H01L 23/50 257/48 |
| 2010/0244161 A1* | 9/2010 | Tabrizi | H01L 23/055 257/415 |
| 2011/0042824 A1* | 2/2011 | Koide | H01L 21/76898 257/774 |
| 2015/0054178 A1 | 2/2015 | Ishii et al. | 257/778 |

FOREIGN PATENT DOCUMENTS

| | | |
|---|---|---|
| JP | 2001-68594 A | 3/2001 |
| JP | 2014-45027 A | 3/2014 |
| JP | 2015-41760 A | 3/2015 |

* cited by examiner

ELECTRONIC COMPONENT

CROSS-REFERENCE TO RELATED APPLICATION

This application is based upon and claims the benefit of priority of the prior Japanese Patent Application No. 2017-176140, filed on Sep. 13, 2017, the entire contents of which are incorporated herein by reference.

FIELD

A certain aspect of the present invention relates to an electronic component.

BACKGROUND

It has been known to improve the connection between a bump and a pad by mounting a device chip on a substrate with use of bumps with different sizes as disclosed in, for example, Japanese Patent Application Publication No. 2015-41760 (hereinafter, referred to as Patent Document 1). It has been known to eliminate the need for highly precise position control of a mounting machine by providing large solder bumps at four corners of a device chip as disclosed in, for example, Japanese Patent Application Publication No. H11-111771 (hereinafter, referred to as Patent Document 2).

SUMMARY OF THE INVENTION

According to an aspect of the present invention, there is provided an electronic component including: a substrate; four device chips each having a rectangular planar shape, the four device chips being arranged on the substrate so that a corner, which is one corner of four corners constituting a rectangle of one device chip of the four device chips, is adjacent to the corner of each of remaining three device chips of the four device chips; a first pad located on a surface at the substrate side of each of the four device chips and closest to the corner; one or more first bumps bonding the first pad to the substrate in each of the four device chips; a second pad located on the surface at the substrate side of each of the four device chips, the second pad being one of pads other than the first pad; and one or more second bumps bonding the second pad to the substrate in each of the four device chips, a sum of bonded areas between the one or more second bumps and the second pad being less than a sum of bonded areas between the first pad and the one or more first bumps.

DETAILED DESCRIPTION

In Patent Documents 1 and 2, influence of a temperature load is not considered. When a plurality of device chips are mounted on a substrate, a large stress is applied to bumps due to a temperature load or the like. Accordingly, the reliability of the bonding between the substrate and the device chip may decrease. As the diameter of the bump is increased, stress applied to the bump decreases. However, a larger diameter of the bump increases the size of the electronic component.

Hereinafter, a description will be given of embodiments with reference to the accompanying drawings.

First Embodiment

Figure 1:
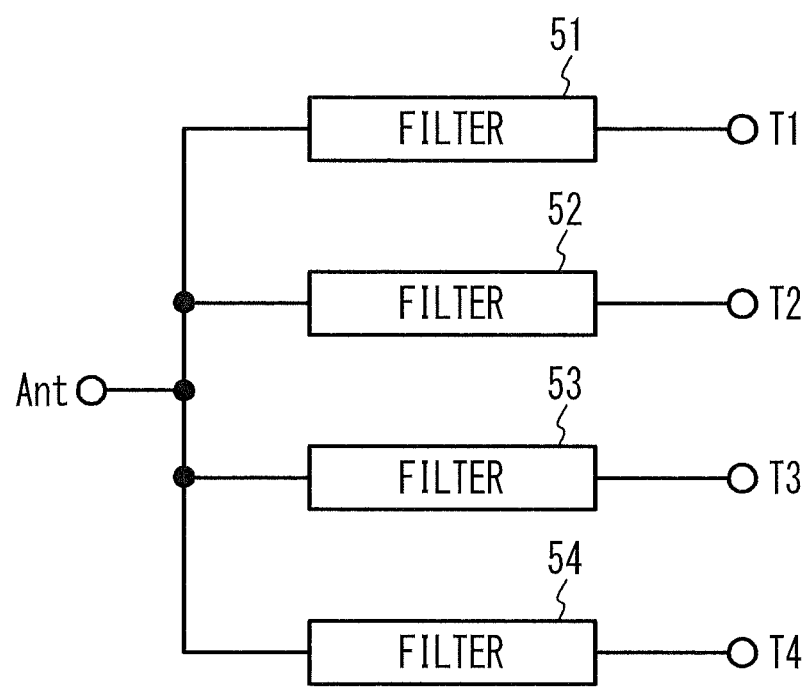
FIG. 1 is a circuit diagram of an electronic component in accordance with a first embodiment.

A first embodiment is an exemplary quadplexer as an electronic component. FIG. 1 is a circuit diagram of an electronic component in accordance with the first embodiment. As illustrated in FIG. 1, the quadplexer includes filters 51 through 54. The filters 51 through 54 are connected between a common terminal Ant and signal terminals T1 through T4, respectively. For example, the filters 51 and 54 are a transmit filter and a receive filter for band B1, respectively. The filters 52 and 53 are a transmit filter and a receive filter for band B2, respectively. Band B1 and band B2 are bands of Long Term Evolution (LTE) band (Evolved Universal Terrestrial Radio Access (E-UTRA) Operating Band).

The filter 51 outputs signals in the transmit band of band B1 to the common terminal Ant among high-frequency signals input to the signal terminal T1, and suppresses other signals. The filter 54 outputs signals in the receive band of band B1 to the signal terminal T4 among high-frequency signals input to the common terminal Ant, and suppresses other signals. The filter 52 outputs signals in the transmit band of band B2 to the common terminal Ant among high-frequency signals input to the signal terminal T2, and suppresses other signals. The filter 53 outputs signals in the receive band of band B2 to the signal terminal T3 among high-frequency signals input to the common terminal Ant, and suppresses other signals.

Figure 2A:
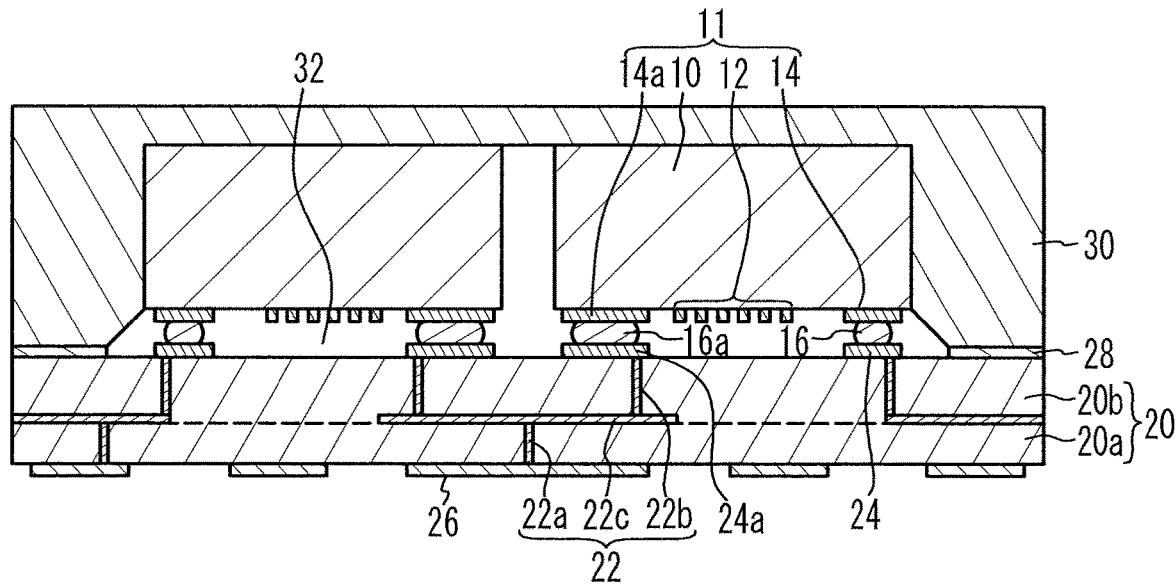
FIG. 2A and FIG. 2B are a cross-sectional view and a plan view of the electronic component of the first embodiment, respectively.
Figure 2B:
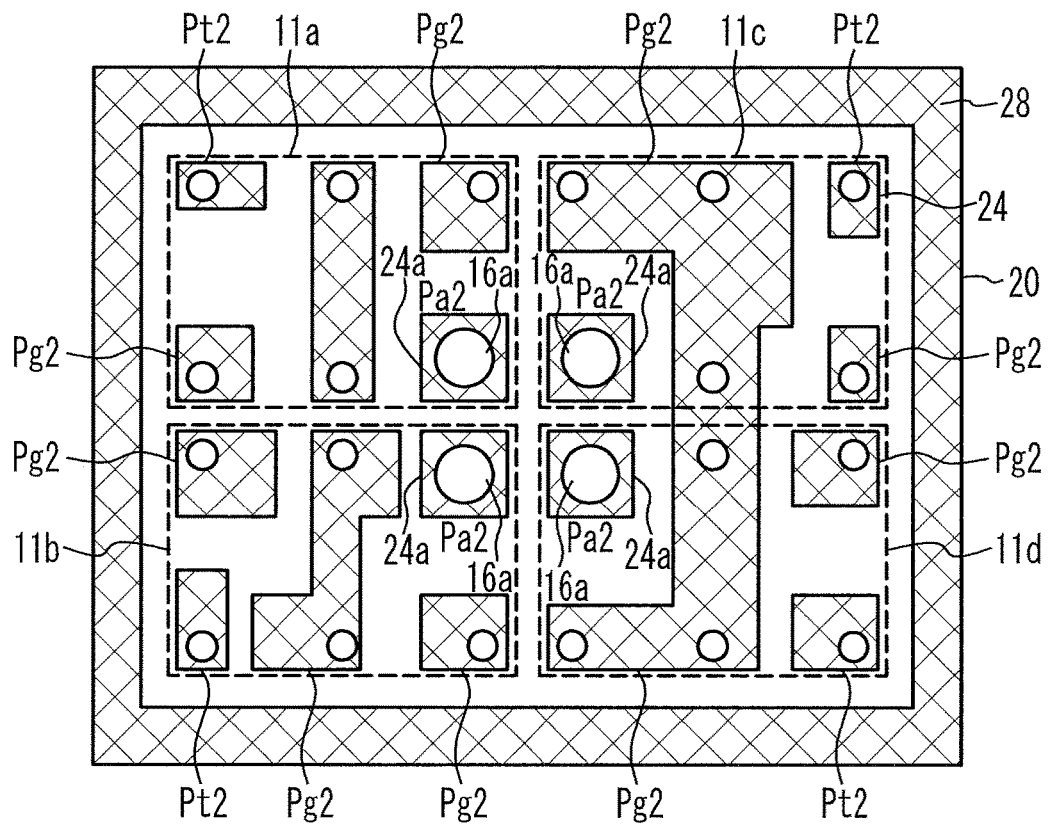

FIG. 2A and FIG. 2B are a cross-sectional view and a plan view of the electronic component of the first embodiment, respectively. FIG. 2B is a top view of a substrate 20, and indicates device chips 11a through 11d by dashed lines. As illustrated in FIG. 2A, the substrate 20 includes one or more insulating layers 20a and 20b. The insulating layers 20a and 20b are, for example, ceramic layers made of High Temperature Co-fired Ceramics (HTCC) or Low Temperature Co-fired Ceramics (LTCC), or resin layers.

Pads 24 and 24a and a ring-shaped metal layer 28 are located on the upper surface of the substrate 20. Terminals 26 are located on the lower surface of the substrate 20. The terminals 26 are, for example, the common terminal Ant, the signal terminals T1 through T4, and ground terminals connected to grounds of the filters 51 through 54. An internal wiring line 22 includes via wirings 22a and 22b and a wiring line 22c. The via wirings 22a and 22b respectively penetrate through the insulating layers 20a and 20b. The wiring line 22c is located between the insulating layers 20a and 20b. The internal wiring lines 22 electrically connect the pads 24 and 24a to the terminals 26. The internal wiring lines 22, the pads 24 and 24a, the terminals 26 and the ring-shaped metal layer 28 are formed of metal layers such as, for example, copper layers, aluminum layers, gold layers, or tungsten layers.

A device chip 11 corresponds to each of the device chips 11a through 11d, and includes the substrate 10, a functional element 12, and pads 14 and 14a. The functional element 12 and the pads 14 and 14a are located on the lower surface of the substrate 10. The functional element 12 corresponds to each of the filters 51 through 54, and faces the substrate 20 across an air gap 32. The substrate 10 is, for example, a lithium tantalate substrate or a lithium niobate substrate. The pads 14 and 14a are formed of metal layers such as, for example, copper layers, aluminum layers, or gold layers. The device chip 11 is flip-chip mounted (face-down mounted) on the substrate 20 through bumps 16 and 16a. The bumps 16 and 16a are, for example, gold bumps, solder bumps, or copper bumps. The bump 16 bonds the pads 24 and 14, and the bump 16a bonds the pads 24a and 14a.

A sealing portion 30 is located on the substrate 20 so as to cover the device chips 11. The sealing portion 30 is bonded to the ring-shaped metal layer 28. The sealing portion 30 is formed of, for example, a metal layer made of solder or a resin layer. A lid may be located on the sealing portion 30 and the device chips 11. The functional element 12 is sealed in the air gap 32 by the sealing portion 30.

As illustrated in FIG. 2B, the four device chips 11a through 11d are flip-chip mounted on the substrate 20. The planar shape of each of the device chips 11a through 11d is rectangular (for example, rectangular or square). The filters 51 through 54 as the functional elements 12 are located on the lower surfaces of the device chips 11a through 11d, respectively. One of the four corners of each of the device chips 11a through 11d faces one of the four corners of each of the remaining device chips. For example, two sides of the four sides of the device chip 11a face the adjacent device chips 11b and 11c. Opposed sides are substantially parallel.

The pads 24 include signal pads Pt2 and ground pads Pg2. The pads 24a include common pads Pa2. In each of the four device chips 11a through 11d, the pad 24a near the center of the substrate 20 is the common pad Pa2, and the pad 24 located diagonally to the common pad Pa2 is the signal pad Pt2. Other pads 24 are the ground pads Pg2. The common pads Pa2 are electrically connected to the common terminal Ant through the internal wiring lines 22. The signal pads Pt2 are electrically connected to the signal terminals T1 through T4 through the internal wiring lines 22. The ground pads Pg2 are electrically connected to ground terminals through the internal wiring lines 22.

The common pads Pa2 of the device chips 11a through 11d are located around the center of the substrate 20 together. This structure makes the electrical lengths between the filters 51 through 54 and the common terminal Ant approximately equal to each other. Thus, the filters 51 through 54 are easily matched. The signal pad Pt2 is located diagonally to the common pad Pa2 in each of the device chips 11a through 11d. This structure inhibits the transmit signal input to the signal pad Pt2 from leaking to the common pad Pa2. In addition, the transmit signal output from the common pad Pa2 is inhibited from leaking to the signal pad Pt2. Thus, the isolation from the transmit terminal to the receive terminal improves. The transmit filter and the receive filter for the same band are preferably diagonally located to each other. For example, the filters 51 through 54 are mounted to the device chips 11a through 11d, respectively. This configuration improves the isolation from the transmit terminal to the receive terminal of the same band.

Figure 3:
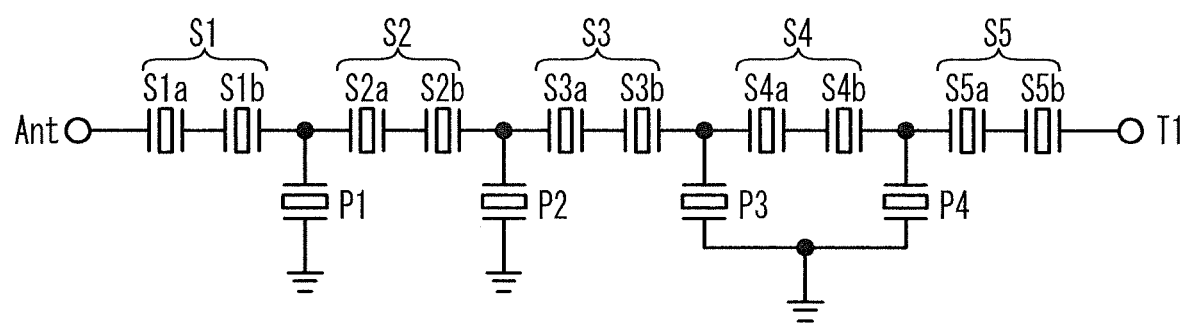
FIG. 3 is a circuit diagram of a filter in the first embodiment.

The device chips 11a through 11d and the filters 51 through 54 will be described with use of the filter 51 of the device chip 11a as an example. FIG. 3 is a circuit diagram of the filter in the first embodiment. As illustrated in FIG. 3, series resonators S1 through S5 are connected in series between the common terminal Ant and the signal terminal T1, and parallel resonators P1 through P4 are connected in parallel between the common terminal Ant and the signal terminal T1. The series resonators S1 through S5 are serially respectively divided into S1a and S1b, S2a and S2b, S3a and S3b, S4a and S4b, and S5a and S5b.

Figure 4:
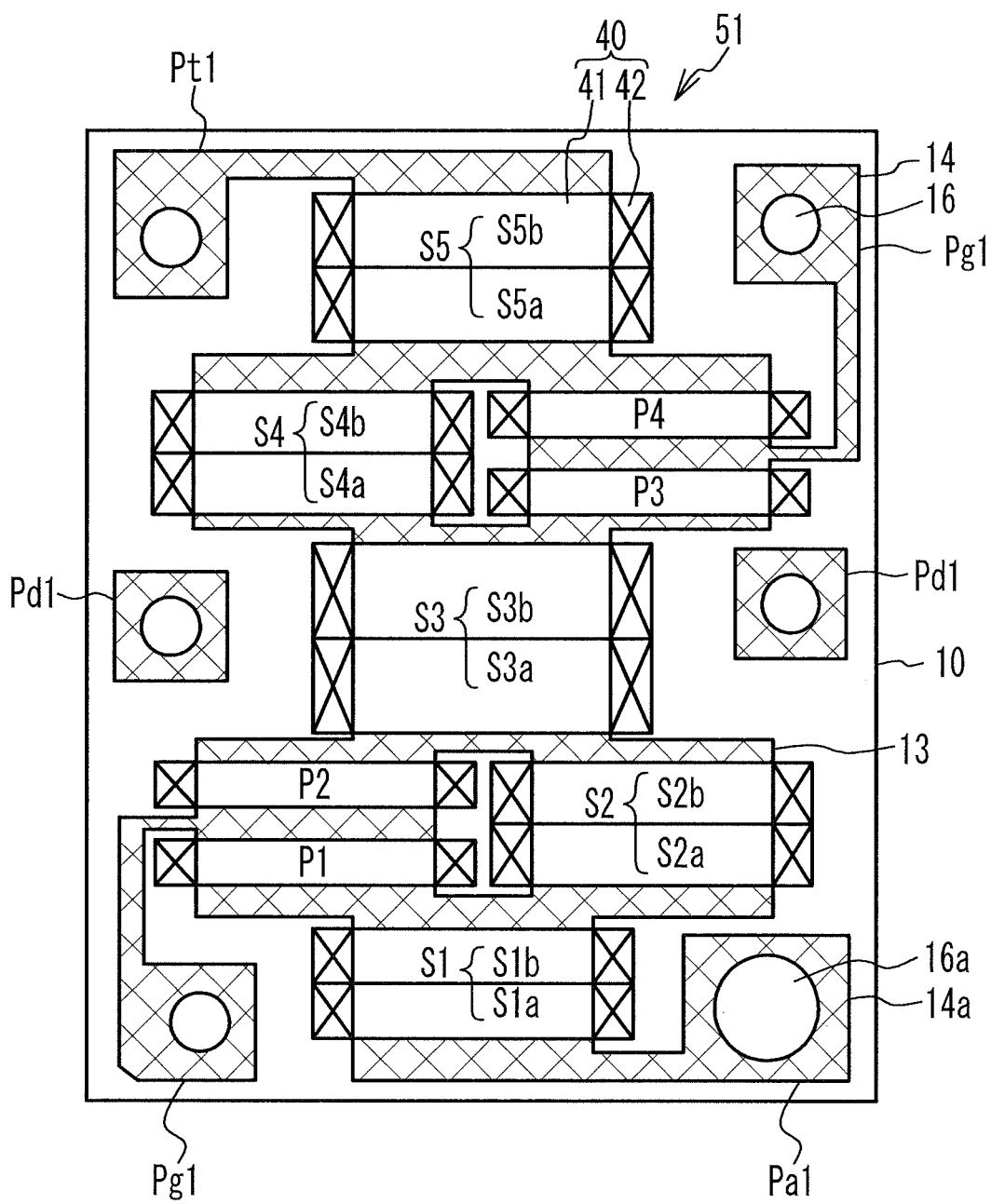
FIG. 4 is a plan view of a device chip in the first embodiment.

FIG. 4 is a plan view of the device chip in the first embodiment. FIG. 4 transparently illustrates the lower surface of the substrate 10 as viewed from above. As illustrated in FIG. 4, acoustic wave resonators 40, wiring lines 13, and the pads 14 and 14a are located on the lower surface of the substrate 10. The acoustic wave resonator 40 includes an Inter Digital Transducer (IDT) 41 and reflectors 42. The wiring line 13 electrically connects the acoustic wave resonators 40 or electrically connects the acoustic wave resonator 40 to the pads 14 and 14a. The bumps 16 and 16a are bonded to the pads 14 and 14a, respectively. The acoustic wave resonators 40 include the series resonators S1 through S5 and the parallel resonators P1 through P4. The pads 14 include a signal pad Pt1, ground pads Pg1, and dummy pads Pd1. The pad 14a includes a common pad Pa1. The dummy pad Pd1 is not connected to the acoustic wave resonator 40 in the device chip 11, and is bonded with a bump for securing mechanical strength.

The common pad Pa1 is electrically connected to the common pad Pa2 through the bump 16a. The signal pad Pt1 is electrically connected to the signal pad Pt2 through the bump 16. The ground pads Pg1 and the dummy pads Pd1 are connected to the ground pads Pg2 through the bumps 16.

Figure 5A:
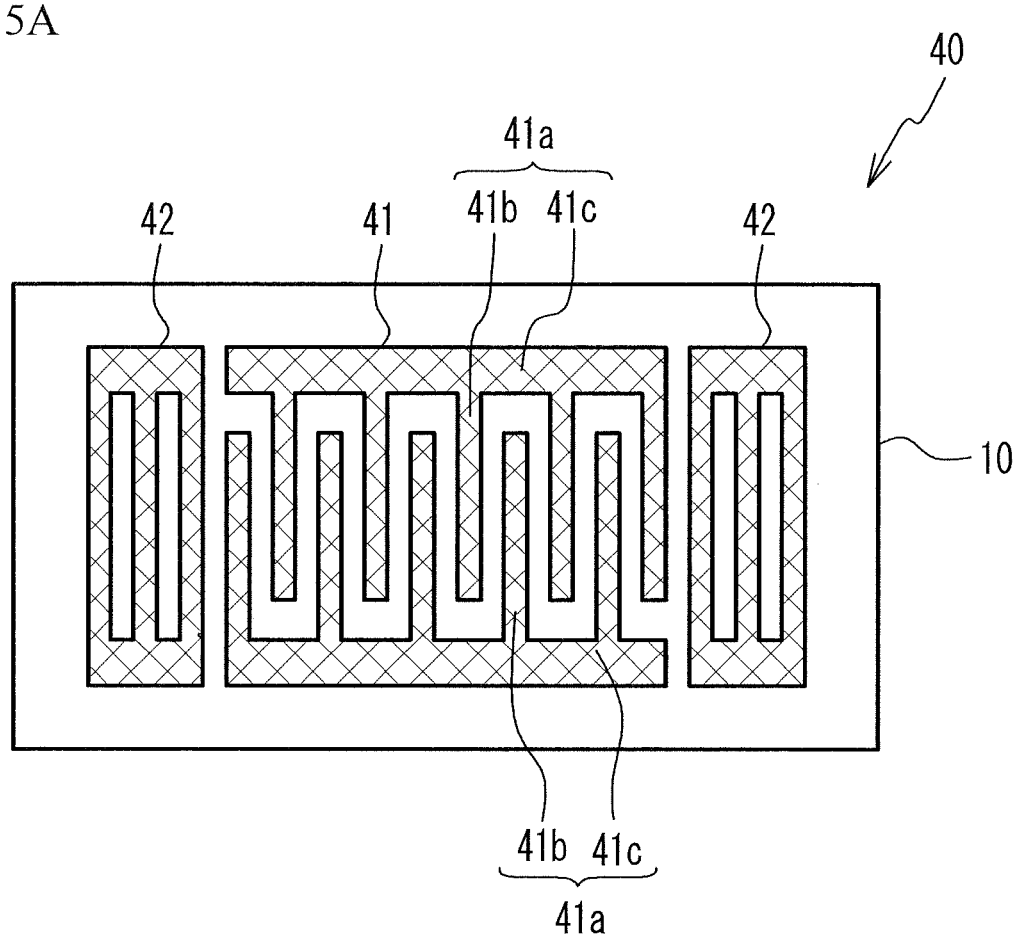
FIG. 5A and FIG. 5B illustrate exemplary acoustic wave resonators.
Figure 5B:
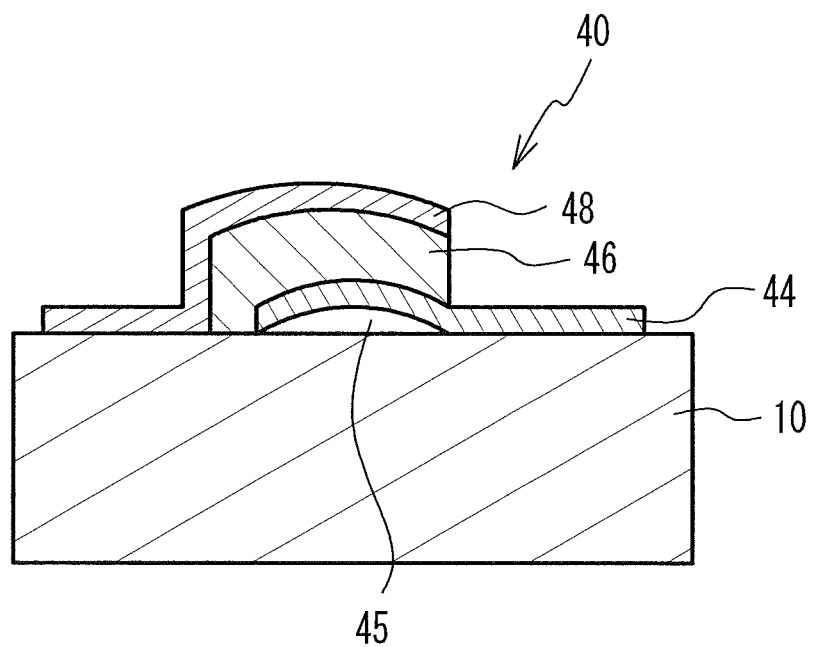

FIG. 5A and FIG. 5B illustrate exemplary acoustic wave resonators. The acoustic wave resonator is a surface acoustic wave resonator in FIG. 5A, and is a piezoelectric thin film resonator in FIG. 5B.

As illustrated in FIG. 5A, the IDT 41 and the reflectors 42 are formed on the substrate 10. The IDT 41 includes a pair of comb-shaped electrodes 41a facing each other. The comb-shaped electrode 41a includes electrode fingers 41b and a bus bar 41c connecting the electrode fingers 41b. The reflectors 42 are located at both sides of the IDT 41. The IDT 41 excites a surface acoustic wave on the substrate 10. The substrate 10 is a piezoelectric substrate such as, for example, a lithium tantalate substrate or a lithium niobate substrate. The IDT 41 and the reflectors 42 are formed of, for example, an aluminum film or a copper film. The substrate 10 may be bonded to a support substrate such as a sapphire substrate, an alumina substrate, a spinel substrate, a crystal substrate, or a silicon substrate. A protective film or a temperature compensation film covering the IDT 41 and the reflectors 42 may be provided. In this case, the surface acoustic wave filter and the protective film or the temperature compensation film function as the acoustic wave resonator 40 as a whole.

As illustrated in FIG. 5B, a piezoelectric film 46 is located on the substrate 10. A lower electrode 44 and an upper electrode 48 are located so as to sandwich the piezoelectric film 46. An air gap 45 is formed between the lower electrode 44 and the substrate 10. The lower electrode 44 and the upper electrode 48 excite an acoustic wave in the thickness extension mode in the piezoelectric film 46. The lower electrode 44 and the upper electrode 48 are formed of, for example, a metal film such as a ruthenium film. The piezoelectric film 46 is, for example, an aluminum nitride film. The substrate 10 is a semiconductor substrate such as, for example, a silicon substrate or a gallium arsenide, or an insulating substrate such as a sapphire substrate, an alumina substrate, a spinel substrate, or a glass substrate. As illustrated in FIG. 5A and FIG. 5B, the acoustic wave resonator 40 includes electrodes exciting an acoustic wave. Thus, the acoustic wave resonator 40 is covered with the air gap 32 so as not to restrict the vibration of the acoustic wave.

In the first embodiment, the diameters of the bumps 16a located at the corners facing each other of the device chips 11a through 11d are greater than the diameters of other bumps 16. For example, the diameters of the bumps 16 and 16a are respectively 60 μm and 120 μm.

Figure 6A:
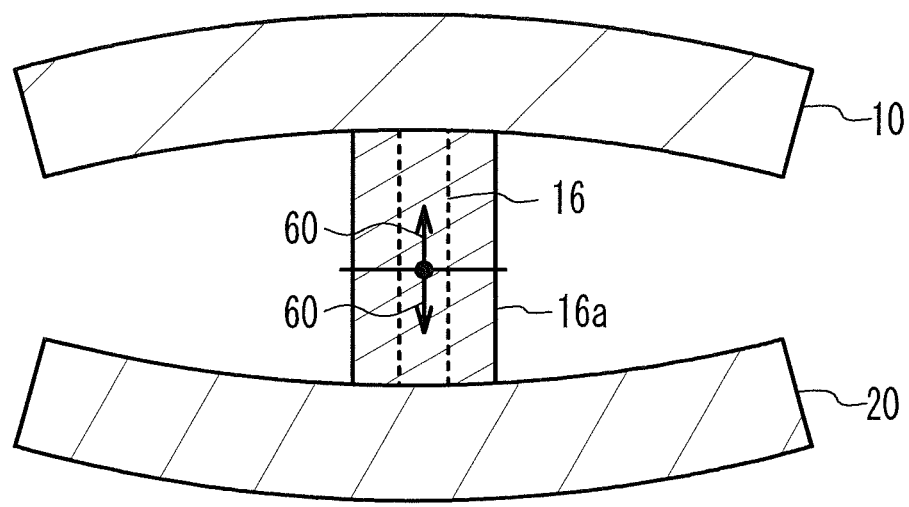
FIG. 6A and FIG. 6B are schematic cross-sectional views for describing advantages in the first embodiment.
Figure 6B:
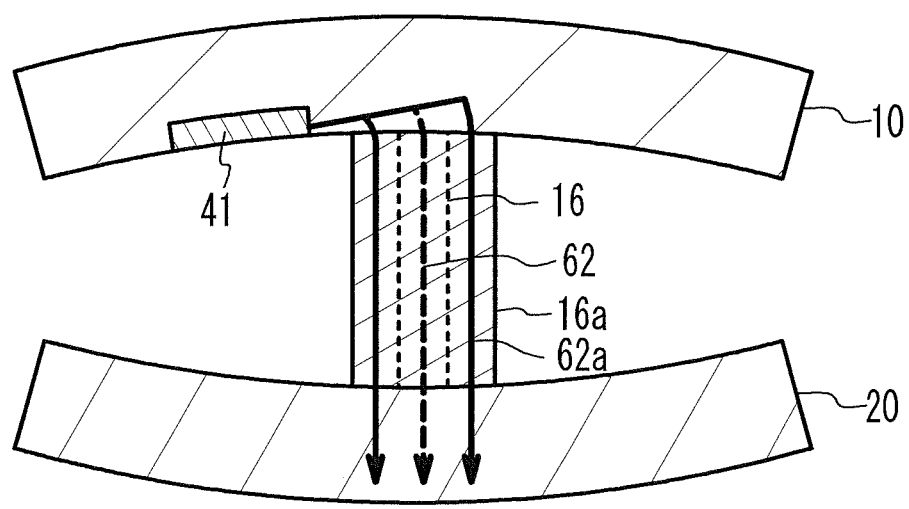

FIG. 6A and FIG. 6B are schematic cross-sectional views for describing advantages in the first embodiment. As illustrated in FIG. 6A, the substrate 10 is bonded on the substrate 20 through the bump 16 or 16a. A large force 60 is applied to the bump 16 or 16a near the center of the substrate 20 due to the difference in linear thermal expansion coefficient between the substrates 20 and 10. The stress is expressed by force/cross-section area. Thus, the bump 16a near the center of the substrate 20 to which a large thermal stress is applied is made to be larger than the bump 16. This configuration reduces the stress applied to the bump 16a.

As illustrated in FIG. 6B, the heat from the IDT 41, which is a heat source, flows to the substrate 20 through the bump 16 or 16a. When the cross-section area of the bump 16a is made to be greater than the cross-section area of the bump 16, the thermal flow from the IDT 41 to the substrate 20 is changed from the thermal flow indicated by an arrow 62 to the increased thermal flow indicated by arrows 62a. Thus, increase in temperature of the substrate 10 is reduced. In the periphery of the substrate 20, heat can be released through the sealing portion 30, but heat release through the sealing portion 30 is difficult near the center of the substrate 20. The first embodiment increases the heat release performance near the center of the substrate 20.

On the other hand, by reducing the cross-section area of the bump 16 to which a small stress is applied, the size of the electronic component is reduced.

Simulation 1

The stress applied to the bump 16a in the first embodiment was simulated. As a first comparative example, the sample using the bump 16 with a small diameter instead of the bump 16a was also simulated.

Figure 7:
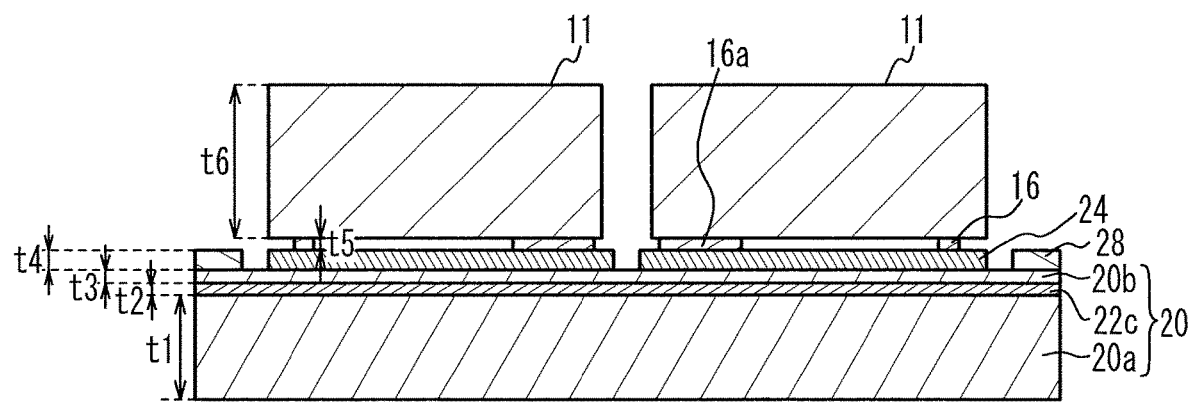
FIG. 7 is a cross-sectional view of a sample in a simulation 1.
Figure 8A:
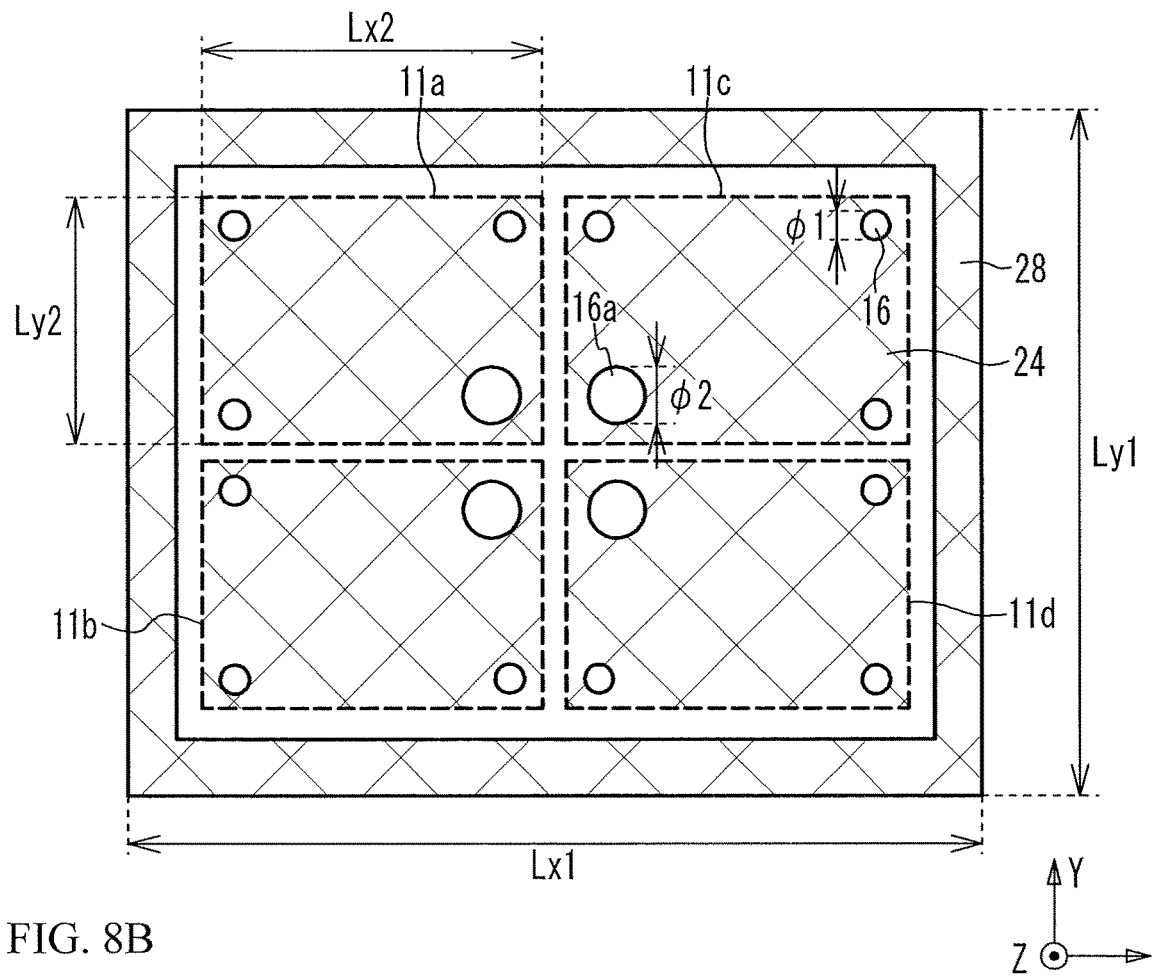
FIG. 8A is a plan view of the upper surface of a substrate 10 in the simulation 1.
Figure 8B:
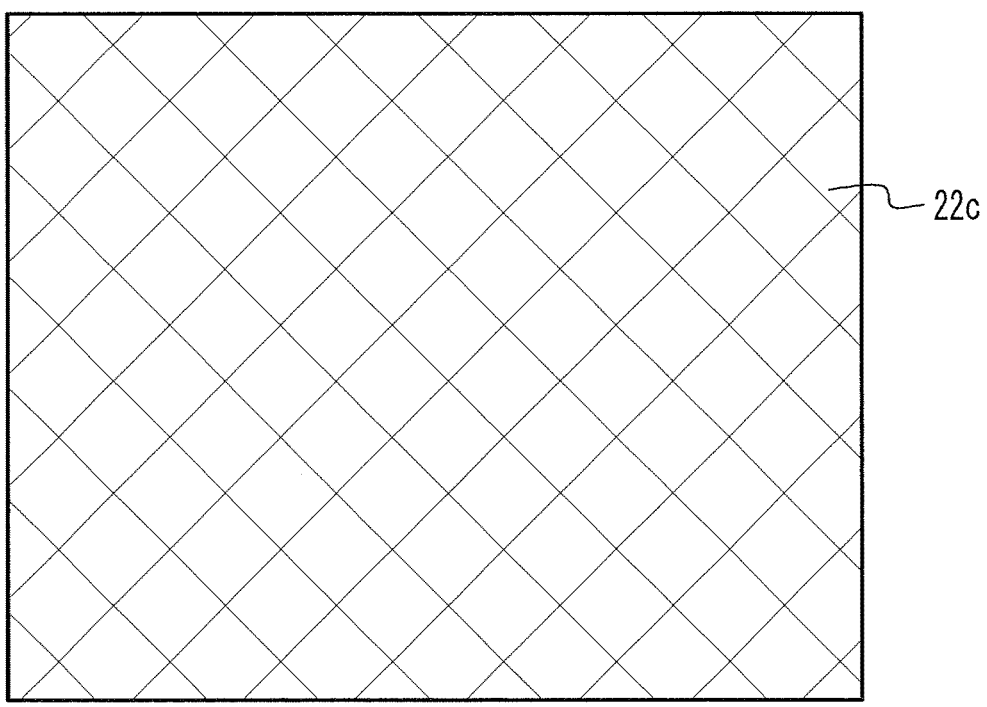
FIG. 8B is a plan view of a wiring line 22c.

FIG. 7 is a cross-sectional view of a sample in the simulation 1, FIG. 8A is a plan view of the upper surface of the substrate 10, and FIG. 8B is a plan view of the wiring line 22c. In FIG. 8A, the device chips 11a through 11d are indicated by dashed lines. As illustrated in FIG. 7 through FIG. 8B, the extension direction of the longer side of the substrate 20 is defined as an X direction, the extension direction of the shorter side is defined as a Y direction, and the normal direction of the upper surface of the substrate 20 is defined as a Z direction. The wiring line 22c is located across the entire surface between the insulating layers 20a and 20b. The pads 24 have the same planer shape as the device chips 11a through 11d.

The conditions of the simulation 1 for the first embodiment are as follows.

Substrate 10: Length Lx1=2.5 mm, length Ly1=2.0 mm
Insulating layer 20a: HTCC with a thickness t1 of 85 μm
Insulating layer 20b: HTCC with a thickness t3 of 10 μm
Wiring line 22c: Tungsten with a thickness t2 of 10 μm
Pad 24, Ring-shaped metal layer 28: Tungsten with a thickness t4 of 15 μm
Bump 16: Gold with a height t5 of 12.5 μm and a diameter φ1 of 60 μm
Bump 16a: Gold with a height t5 of 12.5 μm and a diameter φ2 of 120 μm
Device chips 11a through 11d: 42° rotated Y-cut X-propagation lithium tantalate substrate with a thickness t6 of 0.15 mm, a length Lx2 of 1.01 mm, and a length Ly2 of 0.77 mm, where the Y direction corresponds to the X-axis orientation of the crystal orientation.

The Young's modulus, the Poisson ratio, and the linear thermal expansion coefficient of each material used in the simulation 1 are as follows. Gold has a Young's modulus of $7.72 \times 10^{10}$ GPa, a Poisson ratio of 0.42, and a linear thermal expansion coefficient of $1.44 \times 10^{-5}$/° C. Lithium tantalate has a Young's modulus of $2.54 \times 10^{11}$ GPa, a Poisson ratio of 0.21, and linear thermal expansion coefficients of $0.95 \times 10^{-5}$/° C. (the X direction), $1.61 \times 10^{-5}$/° C. (the Y direction), and $1.07 \times 10^{-5}$/° C. (the Z direction). HTCC has a Young's modulus of $3.1 \times 10^{11}$ GPa, a Poisson ratio of 0.24, and a linear thermal expansion coefficient of $0.71 \times 10^{-5}$/° C. Tungsten has a Young's modulus of $4.0 \times 10^{11}$ GPa, a Poisson ratio of 0.28, and a linear thermal expansion coefficient of $0.44 \times 10^{-5}$/° C. Since the pads 14 and 14a of the device chips 11a through 11d are thin, they are ignored.

Calculated were the maximum value of the stresses in the Z direction in the boundary faces between the bumps 16a and the pads 24 and the maximum value of the stresses in the Z direction in the boundary faces between the bumps 16a and the device chips 11a through 11d. They were calculated for temperatures of 150° C. and −65° C. As the first comparative example, the stress when the bump 16 with a diameter of 60 μm is used instead of the bump 16a was also calculated.

Figure 9A:
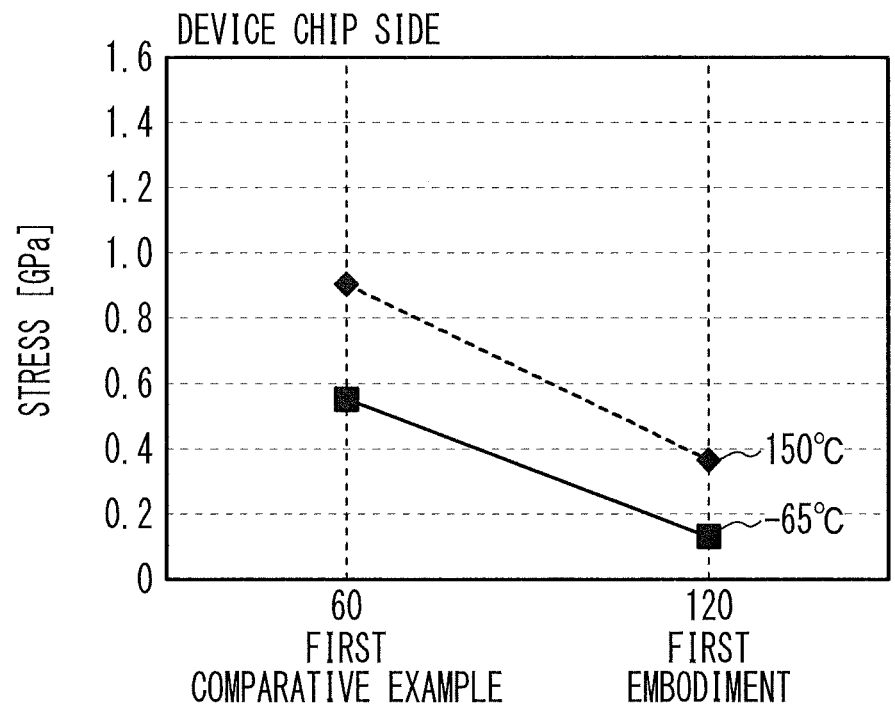
FIG. 9A and FIG. 9B are graphs of stress versus the diameter φ2 of a bump in the simulation 1.
Figure 9B:
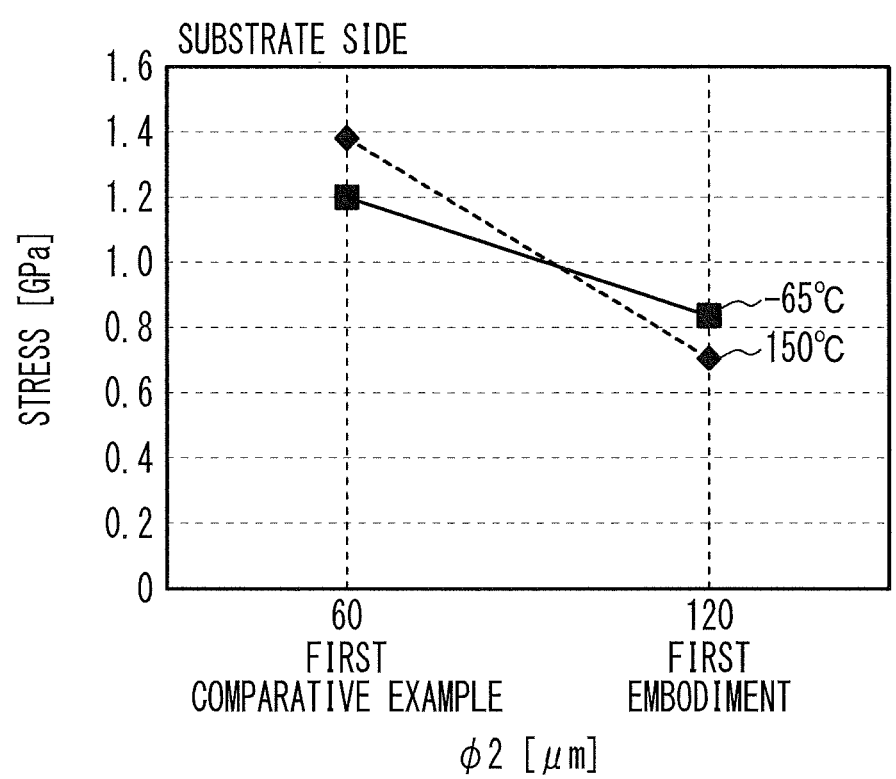

FIG. 9A and FIG. 9B are graphs of stress versus the diameter φ2 of the bump in the simulation 1. FIG. 9A illustrates the stresses in the boundary faces between the bumps 16a and the device chips 11a through 11d (represented as "DEVICE CHIP SIDE"), and FIG. 9B illustrates the stress in the boundary face between the bump 16a and the pad 24a (represented as "SUBSTRATE SIDE"). The sizes Lx2×Ly2 of the device chips 11a through 11d are the same, and thus, the stress applied to the bump 16a is the same among the device chips 11a through 11d.

As illustrated in FIG. 9A and FIG. 9B, the stress in the first embodiment in which the diameter φ2 of the bump 16a is 120 μm is less than the stress in the first comparative example in which the diameter φ2 is 60 μm.

Simulation 2

As a simulation 2, the stress applied to the bump 16a for a case where the planar shapes of the device chips 11a through 11d differ from each other was calculated.

Figure 10:
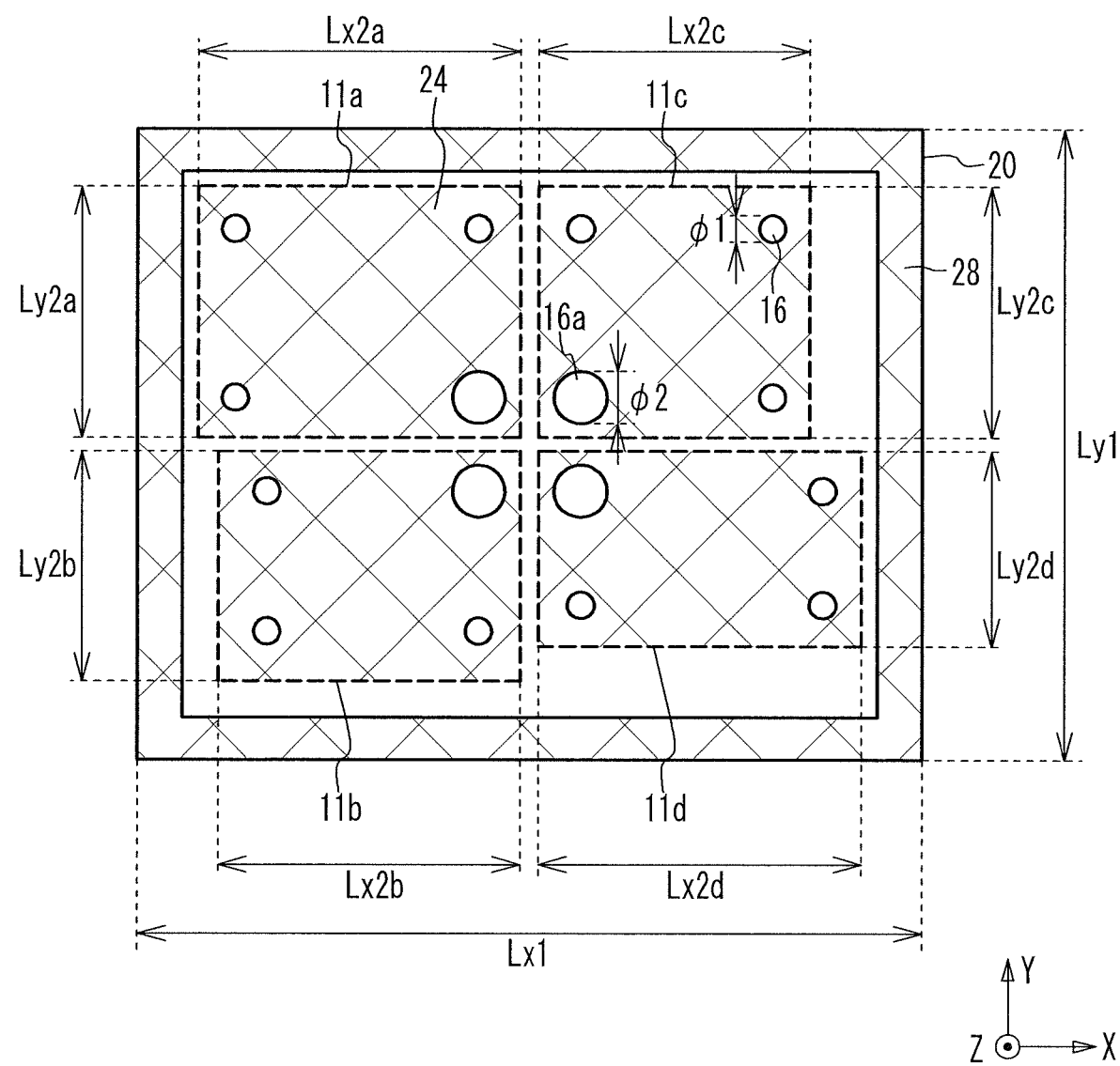
FIG. 10 is a plan view of a sample in a simulation 2.

FIG. 10 is a plan view of a sample in the simulation 2. The planar shapes of the device chips 11a through 11d differ from each other. The pads 24 have the same planar shapes as the respective device chips 11a through 11d. The dimensions of the device chips 11a through 11d were assumed as follows.

Device chip 11a: Lx2a=1.07 mm, Ly2a=0.77 mm
Device chip 11b: Lx2b=0.94 mm, Ly2b=0.70 mm
Device chip 11c: Lx2c=0.84 mm, Ly2c=0.77 mm
Device chip 11d: Lx2d=1.01 mm, Ly2d=0.60 mm Other simulation conditions are the same as those in the simulation 1.

Figure 11A:
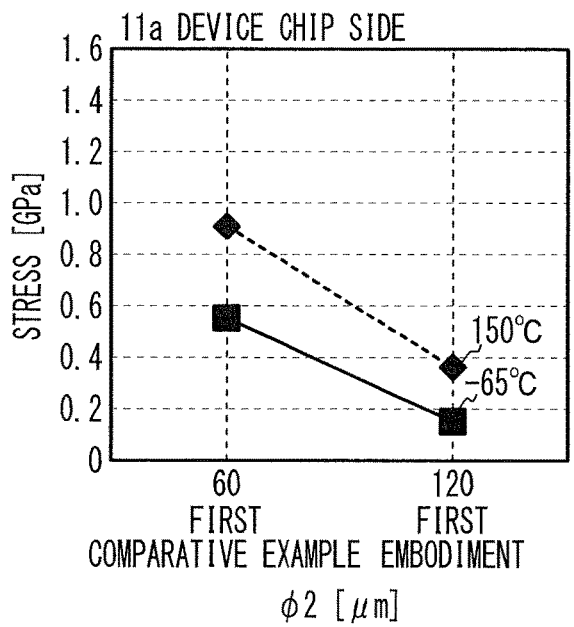
FIG. 11A through FIG. 11D are graphs (No. 1) of stress versus the diameter φ2 of the bump in the simulation 2.
Figure 11B:
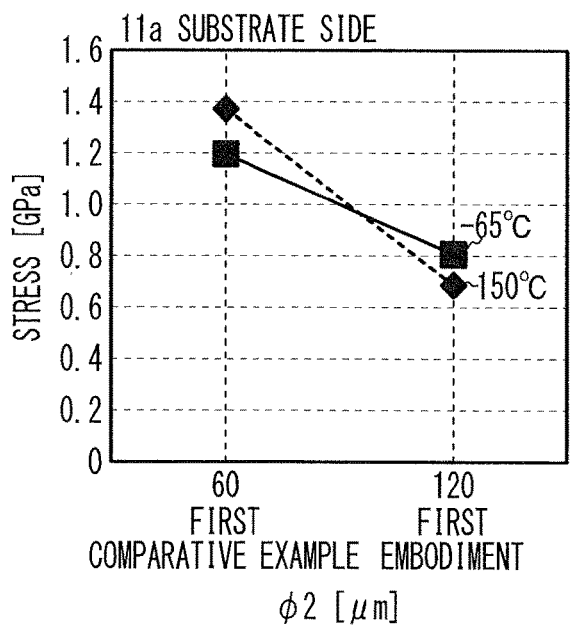
Figure 11C:
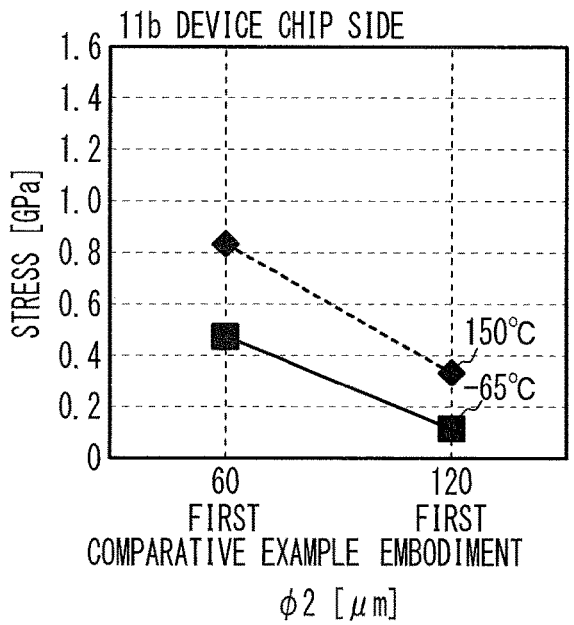
Figure 11D:
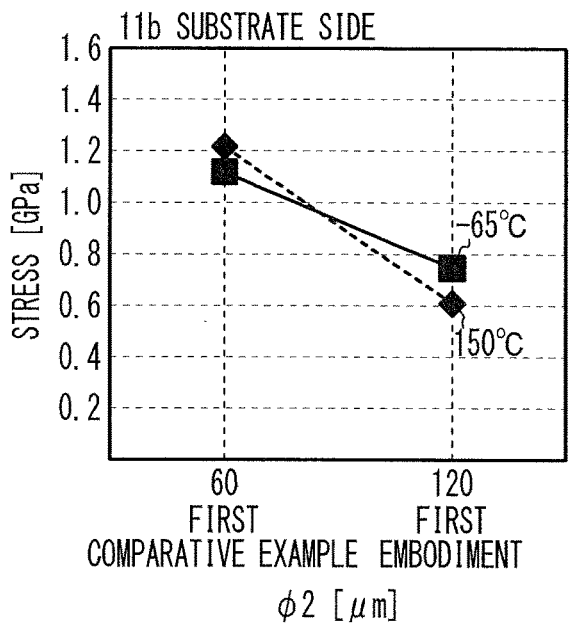
Figure 12A:
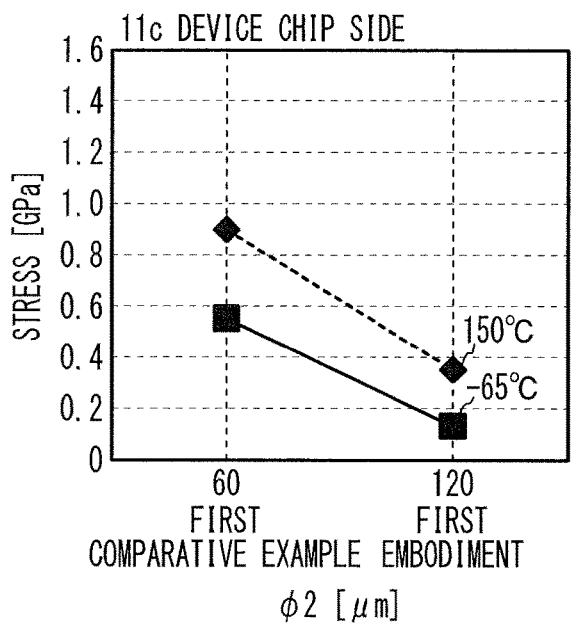
FIG. 12A through FIG. 12D are graphs (No. 2) of stress versus the diameter φ2 of the bump in the simulation 2.
Figure 12B:
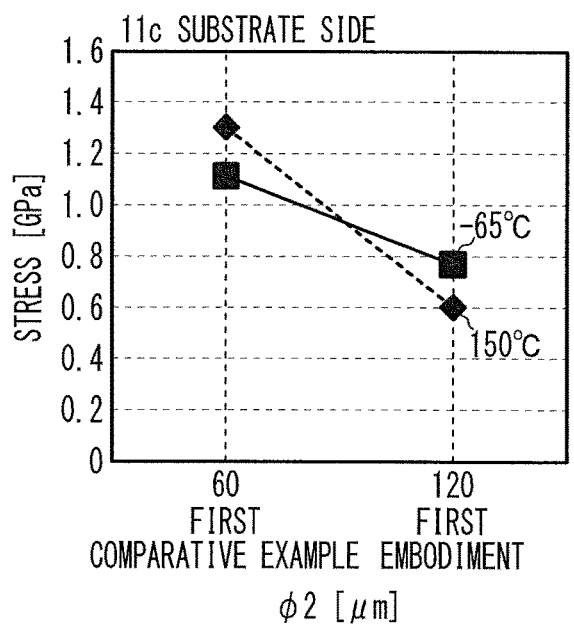
Figure 12C:
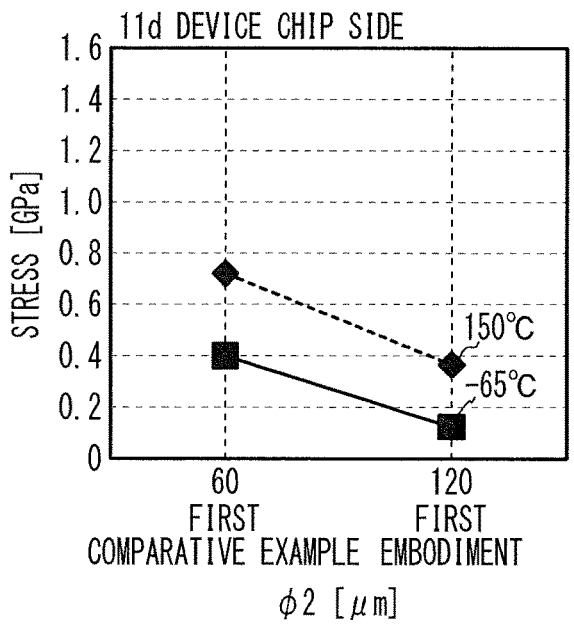
Figure 12D:
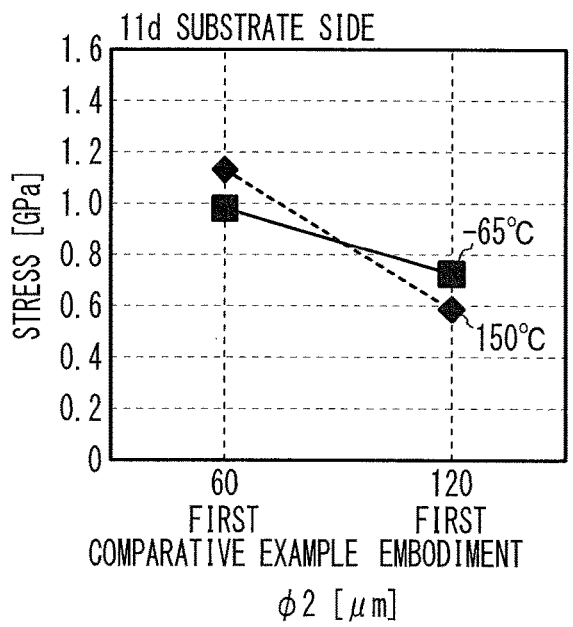

FIG. 11A through FIG. 12D are graphs of stress versus the diameter φ2 of the bump in the simulation 2. FIG. 11A and FIG. 11B illustrate the stress in the bump 16a of the device chip 11a. FIG. 11C and FIG. 11D illustrate the stress in the bump 16a of the device chip 11b. FIG. 12A and FIG. 12B illustrate the stress in the bump 16a of the device chip 11c. FIG. 12C and FIG. 12D illustrate the stress in the bump 16a of the device chip 11d. FIG. 11A, FIG. 11C, FIG. 12A, and FIG. 12C illustrate the stresses in the boundary faces between the bumps 16a and the device chips 11a through 11d (represented as "DEVICE CHIP SIDE"), respectively. FIG. 11B, FIG. 11D, FIG. 12B, and FIG. 12D illustrate the stresses in the boundary face between the bump 16a and the pad 24a (represented as "SUBSTRATE SIDE").

As illustrated in FIG. 11A through FIG. 12D, in any of the device chips 11a through 11d, the stress in the first embodiment in which the diameter φ2 of the bump 16a is 120 μm is less than the stress in the first comparative example in which the diameter φ2 is 60 μm. As described above, regardless of the sizes of the device chips 11a through 11d, the stress applied to the bump 16a in the first embodiment is less than that in the first comparative example.

As described in the simulations 1 and 2, the first embodiment reduces the stress applied to the bump 16a.

First Variation of the First Embodiment

Figure 13:
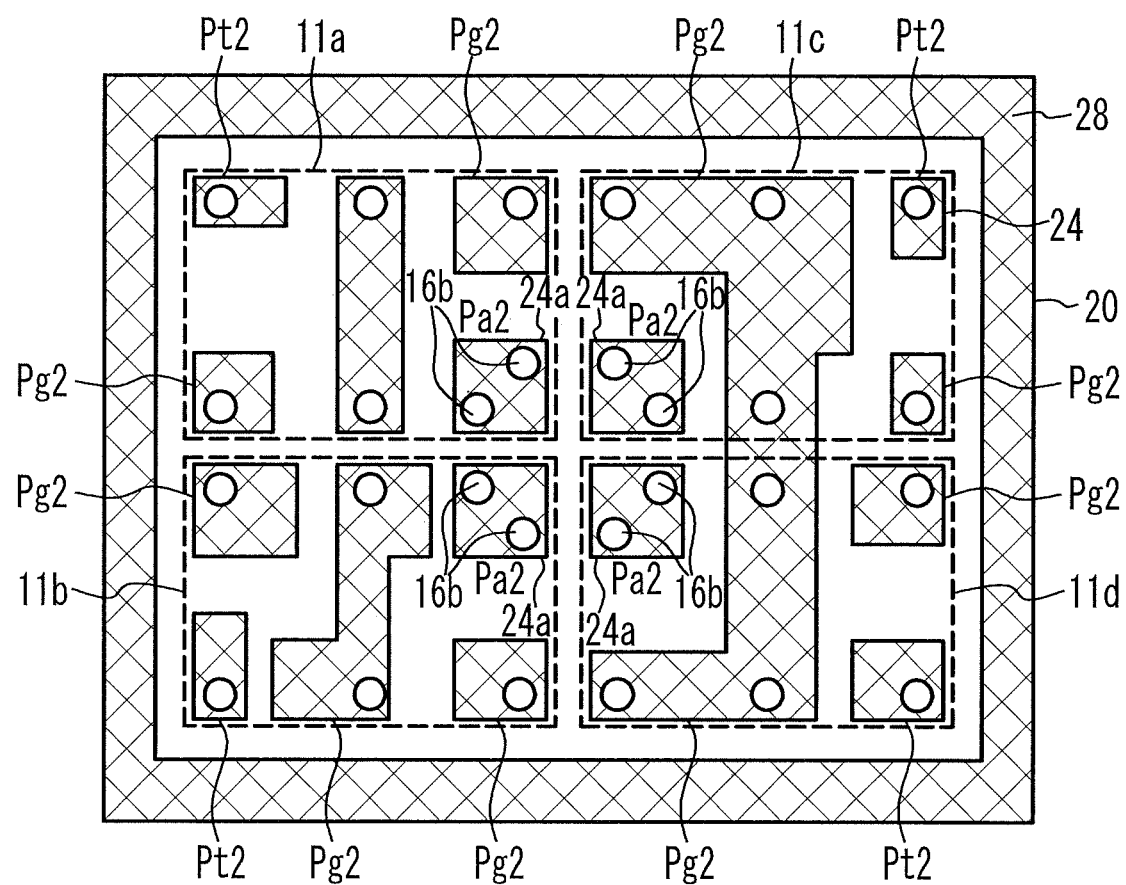
FIG. 13 is a plan view of an electronic component in accordance with a first variation of the first embodiment.

FIG. 13 is a plan view of an electronic component in accordance with a first variation of the first embodiment, and is a top view of the substrate 20, and indicates device chips by dashed lines. As illustrated in FIG. 13, bumps 16b having the same diameters as other bumps 16 are located on the pad 24a. Other structures are the same as those of the first embodiment, and the description thereof is thus omitted.

As in the first variation of the first embodiment, a plurality of the bumps 16b may be located on the pad 24a. That is, it is sufficient if the total area of the bumps 16a or 16b located on the single pad 24a is greater than the area of another bump 16.

In the first embodiment and the variation thereof, one of the four corners of each of the device chips 11a through 11d is adjacent to one of the four corners of each of the remaining device chips. That is, the four device chips 11a through 11d are arranged on the substrate 10 so that a corner that is one of the four corners constituting the rectangle of one device chip is adjacent to a corner that is one of the four corners constituting the rectangle of each of the other three device chips. The pad 14a (a first pad) is a pad closest to the adjacent corners among the pads 14 and 14a located on the surface at the substrate 10 side of each of the device chips 11a through 11d. One or more bumps 16a or 16b (a first bump) bond the pad 14a to the substrate 20. The pad 14 (a second pad) is one of the pads other than the pad 14a among the pads 14 and 14a. The bump 16 (a second bump) bonds the pad 14 to the substrate 20.

In such a structure, the area of one bump 16 in plan view is made to be less than the sum of the areas of one or more bumps 16a or 16b bonded to one pad 14a in plan view. For example, a plurality of the bumps 16 may be located on a single pad 14. For example, the sum of the bonded areas between the pad 14 and one or more bumps 16 located on the single pad 14 is made to be less than the sum of the bonded areas between the pad 14a and one or more bumps 16a or 16b.

This structure reduces the stress applied to the bump 16a or 16b located near the center of the substrate 20 to which a large stress is applied due to a temperature load. Additionally, by making the bump 16 to which a small stress is applied small, the size of the electronic component is reduced. For example, the pad 14 can be made to be smaller than the pad 14a. Additionally, the heat release performance is improved.

When the areas of the bumps 16 and 16a in plan view differ from each other in the Z direction, the area in plan view may be, for example, the maximum area, the minimum area, or the average area. The areas of the bumps 16 in plan view may be approximately equal to each other or different from each other to the extent of production errors. The sum of the areas of one or more bumps 16a or 16b (for example, the bonded areas) in plan view in the device chips 11a through 11d may be substantially equal to each other or different from each other to the extent of production errors.

In one of the four device chips 11a through 11d, the sum of the bonded areas between the pad 14 and one or more bumps 16 is preferably equal to or less than two-thirds of, more preferably equal to or less than a half of, further preferably equal to or less than one-third of the sum of the bonded areas between the pad 14a and one or more bumps 16a or 16b. The bonded area between the pad 14 and one of one or more bumps 16 is preferably less than the sum of the bonded areas of the pad 14a and one or more bumps 16a or 16b, more preferably two-thirds of, further preferably a half of, yet further preferably one-third of the sum of the bonded areas between the pad 14a and one or more bumps 16a or 16b.

As in the first embodiment, only one bump 16a is bonded to each pad 14a. This structure reduces the stress applied to the bump 16a. For example, when the bumps 16 and 16a are formed by plating, the areas of the bumps 16 and 16a in plan view are easily made to differ from each other.

As in the first variation of the first embodiment, a plurality of the bumps 16b are bonded to each pad 14a. This structure reduces the stress applied to the bump 16b.

The bonded area between one of the bumps 16b and the pad 14a is approximately equal to the bonded area between the bump 16 and the pad 14 to the extent of production errors. For example, when the bumps 16 and 16b are formed of stud bumps, it is difficult to make the areas in plan view different. Thus, the number of fabrication steps is reduced by providing the bumps 16b having the same area as the bump 16 to the pad 14a.

The adjacent two sides of the adjacent two device chips (for example, the device chips 11a and 11b) of four device chips 11a through 11d are substantially parallel. This structure reduces the mounting area of the device chips 11a through 11d.

Each of the device chips 11a through 11d includes an acoustic wave element as the functional element 12 facing the substrate 20 across the air gap 32. The functional element 12 may be an acoustic wave filter connected between an input terminal (for example, the common terminal or the receive terminal) and an output terminal (for example, the transmit terminal or the common terminal).

When the bump connected to the input terminal or the output terminal deteriorates, the high-frequency characteristics deteriorate. Thus, the pad 14a is preferably connected to the input terminal or the output terminal.

The filters 51 through 54 are connected between the common terminal Ant and the signal terminals T1 through T4, respectively. In this case, the pad 14a is preferably connected to the common terminal Ant. This configuration reduces deterioration in high-frequency characteristics.

As illustrated in FIG. 2B, the device chips 11a and 11d are diagonally arranged in plan view. In plan view, the device chips 11b and 11c are diagonally arranged. The filters 51 and 54 are a receive filter and a transmit filter for band B1 (a first band), respectively. The filters 52 and filter 53 are a receive filter and a transmit filter for band B2 (a second band) different from band B1, respectively. This configuration allows to arrange the receive terminal of the receive filter away from the transmit terminal of the transmit filter for the same band. Thus, the isolation between the transmission and reception is made to be large. In particular, when band B1 and/or B2 is a band of a Frequency Division Duplex (FDD) method, since the receive band does not overlap with the transmit band in the band, the isolation between the transmission and the reception is important. Thus, the filters 51 and 54 are preferably the receive filter and the transmit filter for band B1, and the filters 52 and 53 are preferably the receive filter and the transmit filter for the band B2.

An acoustic wave element has been described as an example of the functional element 12, but the functional element 12 may be a passive element such as an inductor or a capacitor, an active element such as a power amplifier or a switch, or a Micro Electro Mechanical Systems (MEMS) element.

A quadplexer has been described as an example using four filters, but other multiplexers may be employed. Five or more device chips may be mounted on the substrate 20.

Although the embodiments of the present invention have been described in detail, it is to be understood that the various change, substitutions, and alterations could be made hereto without departing from the spirit and scope of the invention.

What is claimed is:

1. An electronic component comprising:
   a substrate;
   four device chips each having a rectangular planar shape, the four device chips being arranged on the substrate so that a corner, which is one corner of four corners constituting a rectangle of one device chip of the four device chips, is adjacent to the corner of each of remaining three device chips of the four device chips;
   a first pad located on a surface at the substrate side of each of the four device chips and closest to the corner;
   one or more first bumps bonding the first pad to the substrate in each of the four device chips;
   a second pad located on the surface at the substrate side of each of the four device chips, the second pad being one of pads other than the first pad; and
   one or more second bumps bonding the second pad to the substrate in each of the four device chips, a sum of bonded areas between the second pad and the one or more second bumps being less than a sum of bonded areas between the first pad and the one or more first bumps,
   wherein
   each of the four device chips includes an acoustic wave element facing the substrate across an air gap.

2. The electronic component according to claim 1, wherein
   in one of the four device chips, the sum of the bonded areas between the second pad and the one or more second bumps is equal to or less than two-thirds of the sum of the bonded areas between the first pad and the one or more first bumps.

3. The electronic component according to claim 1, wherein
   in each of the four device chips, only one first bump is bonded with the first pad.

4. The electronic component according to claim 1, wherein
   in each of the four device chips, a plurality of first bumps is bonded with the first pad.

5. The electronic component according to claim 4, wherein
   in each of the four device chips, a bonded area between the first pad and one of a plurality of the first bumps is approximately equal to a bonded area between the second pad and one of the one or more second bumps.

6. The electronic component according to claim 1, wherein
   adjacent two sides of adjacent two device chips of the four device chips are substantially parallel.

7. The electronic component according to claim 1, wherein
   each of the four device chips includes an acoustic wave filter facing the substrate across an air gap and connected between a common terminal and a signal terminal, and
   the first pad is coupled to the common terminal.

8. The electronic component according to claim 1, wherein
   in each of the four device chips, a bonded area between the second pad and one of the one or more second bumps is less than the sum of the bonded areas between the first pad and the one or more first bumps.

9. The electronic component according to claim 1, wherein
   in each of the four device chips, only one second bump is bonded with the second pad.

10. An electronic component comprising:
    a substrate;
    four device chips each having a rectangular planar shape, the four device chips being arranged on the substrate so that a corner, which is one corner of four corners constituting a rectangle of one device chip of the four device chips, is adjacent to the corner of each of remaining three device chips of the four device chips;
    a first ad located on a surface at the substrate side of each of the four device chips and closest to the corner;
    one or more first bumps bonding the first pad to the substrate in each of the four device chips;
    a second pad located on the surface at the substrate side of each of the four device chips, the second pad being one of pads other than the first pad; and
    one or more second bumps bonding the second pad to the substrate in each of the four device chips, a sum of bonded areas between the second pad and the one or more second bumps being less than a sum of bonded areas between the first pad and the one or more first bumps,
    wherein
    each of the four device chips includes an acoustic wave filter facing the substrate across an air gap and connected between an input terminal and an output terminal.

11. The electronic component according to claim 10, wherein the first pad is coupled to the input terminal or the output terminal.

12. The electronic component according to claim 10, wherein
in one of the four device chips, the sum of the bonded areas between the second pad and the one or more second bumps is equal to or less than two-thirds of the sum of the bonded areas between the first pad and the one or more first bumps.

13. The electronic component according to claim 10, wherein
in each of the four device chips, only one first bump is bonded with the first pad.

14. The electronic component according to claim 10, wherein
in each of the four device chips, a plurality of first bumps is bonded with the first pad.

15. The electronic component according to claim 10, wherein
in each of the four device chips, a bonded area between the first pad and one of a plurality of the first bumps is approximately equal to a bonded area between the second pad and one of the one or more second bumps.

16. The electronic component according to claim 10, wherein
adjacent two sides of adjacent two device chips of the four device chips are substantially parallel.

17. The electronic component according to claim 10, wherein
in each of the four device chips, a bonded area between the second pad and one of the one or more second bumps is less than the sum of the bonded areas between the first pad and the one or more first bumps.

18. The electronic component according to claim 10, wherein
in each of the four device chips, only one second bump is bonded with the second pad.

* * * * *